United States Patent
Tsuchitani et al.

(10) Patent No.: US 7,906,416 B2
(45) Date of Patent: Mar. 15, 2011

(54) METHOD FOR MANUFACTURING SEMICONDUCTOR DEVICE

(75) Inventors: Masanobu Tsuchitani, Kanagawa-ken (JP); Hideki Nozaki, Kanagawa-ken (JP); Motoshige Kobayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 614 days.

(21) Appl. No.: 11/871,525

(22) Filed: Oct. 12, 2007

(65) Prior Publication Data
US 2008/0090391 A1 Apr. 17, 2008

(30) Foreign Application Priority Data
Oct. 13, 2006 (JP) ................... 2006-280787

(51) Int. Cl.
H01L 21/00 (2006.01)
(52) U.S. Cl. .......................... 438/510; 438/288; 438/285
(58) Field of Classification Search .................. 438/510, 438/285, 288
See application file for complete search history.

(56) References Cited

U.S. PATENT DOCUMENTS

| | | | |
|---|---|---|---|
| 6,037,632 A * | 3/2000 | Omura et al. ................. | 257/341 |
| 6,710,418 B1 * | 3/2004 | Sapp ............................. | 257/471 |
| 7,038,272 B2 * | 5/2006 | Weber et al. ................... | 257/329 |
| 7,161,208 B2 * | 1/2007 | Spring et al. .................. | 257/328 |
| 7,224,008 B2 * | 5/2007 | Rahimo et al. ................ | 257/288 |
| 7,268,079 B2 * | 9/2007 | Falck et al. .................... | 438/689 |
| 7,576,388 B1 * | 8/2009 | Wilson et al. .................. | 257/330 |
| 7,675,111 B2 * | 3/2010 | Arai ............................... | 257/330 |
| 7,745,289 B2 * | 6/2010 | Bencuya et al. ............... | 438/270 |
| 2004/0065909 A1 * | 4/2004 | Weber et al. ................... | 257/285 |
| 2006/0022261 A1 * | 2/2006 | Rahimo et al. ................ | 257/327 |
| 2006/0051923 A1 * | 3/2006 | Falck et al. .................... | 438/285 |
| 2007/0020887 A1 | 1/2007 | Sekiya | |
| 2008/0090391 A1 * | 4/2008 | Tsuchitani et al. ............ | 438/510 |

FOREIGN PATENT DOCUMENTS

| JP | 2006-59876 | 3/2006 |
|---|---|---|
| JP | 2007-35756 | 2/2007 |

* cited by examiner

Primary Examiner — Laura M Menz
(74) Attorney, Agent, or Firm — Oblon, Spivak, McClelland, Maier & Neustadt, L.L.P.

(57) ABSTRACT

A method for manufacturing a semiconductor device from a semiconductor wafer having a first major surface, a recess provided inside a periphery on opposite side of the first major surface and surrounded by the periphery, and a second major surface provided at bottom of the recess is provided. The method comprises: fitting into the recess a doping mask having selectively formed openings to selectively cover the second major surface with the doping mask; and selectively introducing dopant into the second major surface.

9 Claims, 8 Drawing Sheets

US 7,906,416 B2

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2006-280787, filed on Oct. 13, 2006; the entire contents of which are incorporated herein by reference.

BACKGROUND OF THE INVENTION

1. Field of the Invention

This invention relates to a method for manufacturing a semiconductor device.

2. Background Art

An IGBT (insulated gate bipolar transistor), which can achieve lower ON resistance than a vertical MOSFET (metal-oxide-semiconductor field effect transistor), is particularly suitable for use in high-current applications.

An IGBT with an anode short structure on the rear electrode side is also proposed (see, e.g., JP-A 2006-059876 (Kokai)). Formation of an anode short structure requires the step of selectively implanting dopant ions into the anode layer (collector layer). However, when the semiconductor wafer used has a structure where one of its surfaces is significantly recessed except its periphery, it is difficult to uniformly spin-coat the bottom of the recessed portion with a resist, which results in difficulty in forming a resist mask for selectively implanting dopant ions.

SUMMARY OF THE INVENTION

According to an aspect of the invention, there is provided a method for manufacturing a semiconductor device from a semiconductor wafer having a first major surface, a recess provided inside a periphery on opposite side of the first major surface and surrounded by the periphery, and a second major surface provided at bottom of the recess, the method including: fitting into the recess a doping mask having selectively formed openings to selectively cover the second major surface with the doping mask; and selectively introducing dopant into the second major surface.

According to another aspect of the invention, there is provided a method for manufacturing a semiconductor device from a semiconductor wafer having a first major surface, a recess provided inside a periphery on opposite side of the first major surface and surrounded by the periphery, and a second major surface provided at bottom of the recess, the method including: forming a semiconductor layer of a first conductive type on a surface portion of the second major surface of the semiconductor wafer by introducing dopant into an entire surface of the second major surface of the semiconductor wafer and activating the introduced dopant; and selectively introducing dopant of a second conductivity type into the semiconductor layer of the first conductivity type, selectively covering a surface of the semiconductor layer of the first conductivity type with a doping mask having selectively formed openings by fitting the doping mask into the recess of the semiconductor wafer.

DETAILED DESCRIPTION OF THE INVENTION

An embodiment of the invention will now be described with reference to the drawings.

This embodiment is described with reference to an insulated gate bipolar transistor (IGBT), taken as an example of the semiconductor device.

Figure 7:
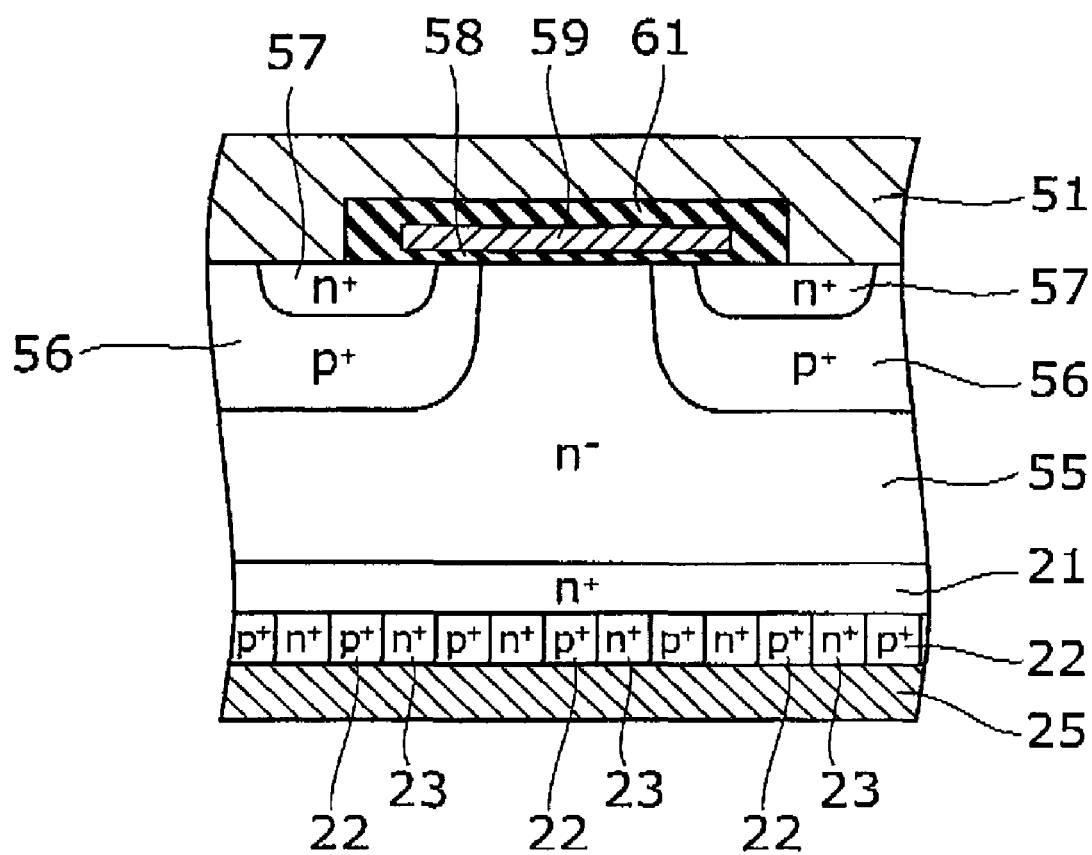
FIG. 7 is a schematic view illustrating the cross section of the main part of an IGBT having a planar gate structure.

FIG. 7 is a schematic view illustrating the cross section of the main part of an IGBT having a planar gate structure.

Figure 8:
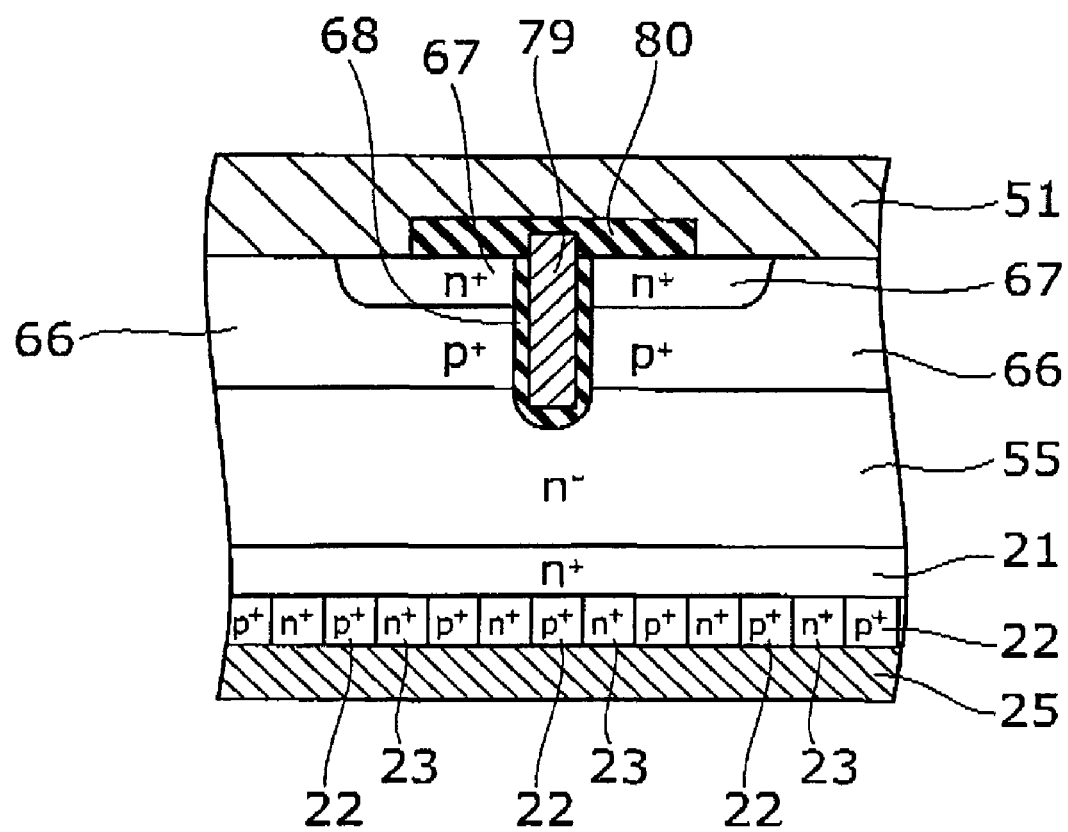
FIG. 8 is a schematic view illustrating the cross section of the main part of an IGBT having a trench gate structure.

FIG. 8 is a schematic view illustrating the cross section of the main part of an IGBT having a trench gate structure.

The IGBT having a planar gate structure shown in FIG. 7 includes an $n^+$-type buffer layer 21 and an $n^-$-type base layer 55 sequentially on a $p^+$-type anode layer (or collector layer) 22. A $p^+$-type base region 56 is selectively provided in the surface portion of the $n^-$-type base layer 55, and an $n^+$-type cathode region (or emitter region) 57 is selectively provided in the surface of the base region 56.

A control electrode 59 is provided via an insulating film 58 on the surface extending from a portion of the cathode region 57 through the base region 56 to the $n^-$-type base layer 55. The surface portion of the base region 56 opposed to the control electrode 59 across the insulating film 58 functions as a channel formation region.

The control electrode 59 is covered with an interlayer insulating film 61, and a first main electrode 51 is provided in contact with the cathode region 57 so as to cover the interlayer insulating film 61. A second main electrode 25 is provided on the backside of the anode layer 22. In the anode layer 22, $n^+$-regions 23 are selectively provided. The $n^+$-region 23 is in contact with the buffer layer 21 and the second main electrode 25.

The IGBT having a trench gate structure shown in FIG. 8 includes an $n^+$-type buffer layer 21 and an $n^-$-type base layer 55 sequentially on a $p^+$-type anode layer (or collector layer) 22. A $p^+$-type base region 66 is provided in the surface portion of the $n^-$-type base layer 55, and an $n^+$-type cathode region (or emitter region) 67 is selectively provided in the surface of the base region 66.

From the surface of the cathode region 67, a trench is formed through the cathode region 67 and the base region 66 to the $n^-$-type base layer 55. The trench is filled in with a control electrode 79 via an insulating film 68. In the base region 66, the portion opposed to the control electrode 79 across the insulating film 68 functions as a channel formation region.

A first main electrode 51 is provided on the surface of the cathode region 67 and the base region 66. An interlayer insulating film 80 is interposed between the first main electrode 51 and the control electrode 79. A second main electrode 25 is provided on the backside of the anode layer 22. In the anode layer 22, n$^+$-regions 23 are selectively provided. The n$^+$-region 23 is in contact with the buffer layer 21 and the second main electrode 25.

In the IGBT described above, upon application of a desired control voltage (gate voltage) to the control electrode 59, 79, an n-channel is formed in the channel formation region opposed to the control electrode 59, 79 across the insulating film 58, 68, and the path between the first main electrode 51 and the second main electrode 25 is turned into the ON state. In an IGBT, electrons and holes are injected from the cathode and the anode, respectively, and carriers are accumulated in the n$^-$-type base layer 55, thereby causing conductivity modulation. Hence the ON resistance can be made lower than in the vertical MOSFET (metal-oxide-semiconductor field effect transistor).

Furthermore, the IGBT shown in FIGS. 7 and 8 has an anode short structure where n$^+$-regions 23 in contact with the second main electrode 25 are selectively provided in the anode layer 22. While injection of holes from the anode layer 22 into the n$^-$-type base layer 55 is prevented during switch-on, holes can be ejected through the n$^+$-regions 23 to the second main electrode 25 during switch-off. Consequently, the turn-off time can be reduced.

FIGS. 3A, 3B, 4A, 4B and 4C are process cross-sectional views showing a method for forming the anode short structure.

The semiconductor wafer W used in this embodiment includes a first major surface 11, a recess 13 provided inside a periphery 14 on the opposite side of the first major surface 11 and surrounded by the periphery 14, and a second major surface 12 provided at the bottom of the recess 13. The semiconductor wafer is thinned by grinding from one major surface side so as to leave the periphery 14, and thus warpage associated with thinning can be prevented. In the semiconductor wafer W, the thickness X of its edge constituting the periphery 14 is illustratively 600 to 800 μm, and the thickness Y of the portion inside the periphery 14 is illustratively 100 μm. The thickness Z in the surface direction of the periphery 14 (lateral thickness in FIG. 3) is illustratively 3 mm.

Figure 3A:
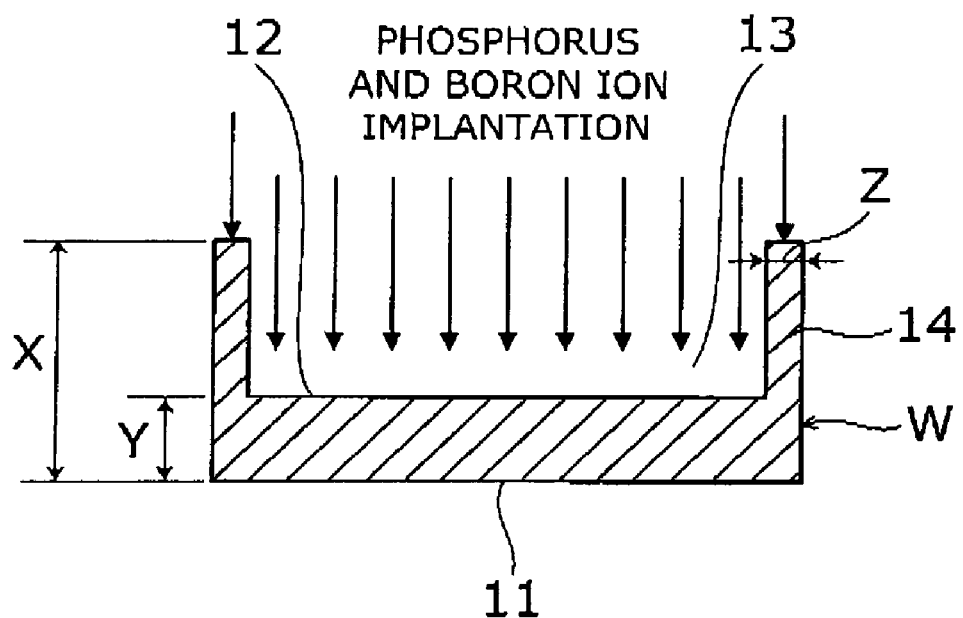
FIGS. 3A and 3B are cross-sectional views showing a main part of a process in the method for manufacturing a semiconductor device according to the embodiment of the invention.

After the IGBT process on the frontside (first major surface 11) is completed, as shown in FIG. 3A, phosphorus and boron serving as n-type dopant and p-type dopant, respectively, are first implanted into the second major surface 12 of the semiconductor wafer W. For example, phosphorus is implanted at an acceleration voltage of 360 keV and a dose amount of $2\times10^{12}/cm^2$, and boron is implanted at an acceleration voltage of 20 keV and a dose amount of $2\times10^{14}/cm^2$. Phosphorus and boron are implanted into the entire surface of the periphery 14 and the second major surface 12.

Figure 3B:
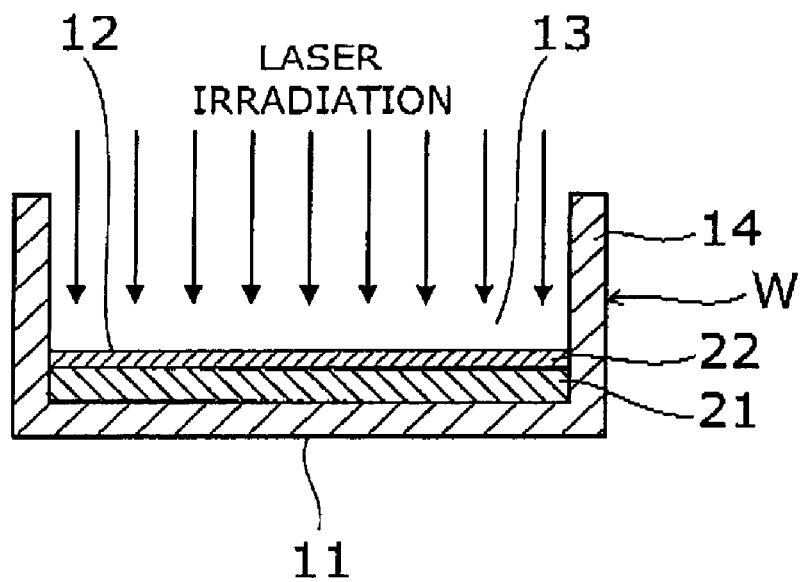

Next, the entire surface of the second major surface 12 is laser-irradiated at an energy density of e.g. 1.4 J/cm$^2$ to activate phosphorus and boron implanted in the step of FIG. 3A. Thus, as shown in FIG. 3B, a p$^+$-type collector layer 22 and an n$^+$-type buffer layer 21 are formed in the surface portion on the second major surface 12 side sequentially from the second major surface 12 side.

Next, n-type dopant tons are selectively implanted into the collector layer 22. This ion implantation is performed by using a doping mask having selectively formed openings.

Figure 1:
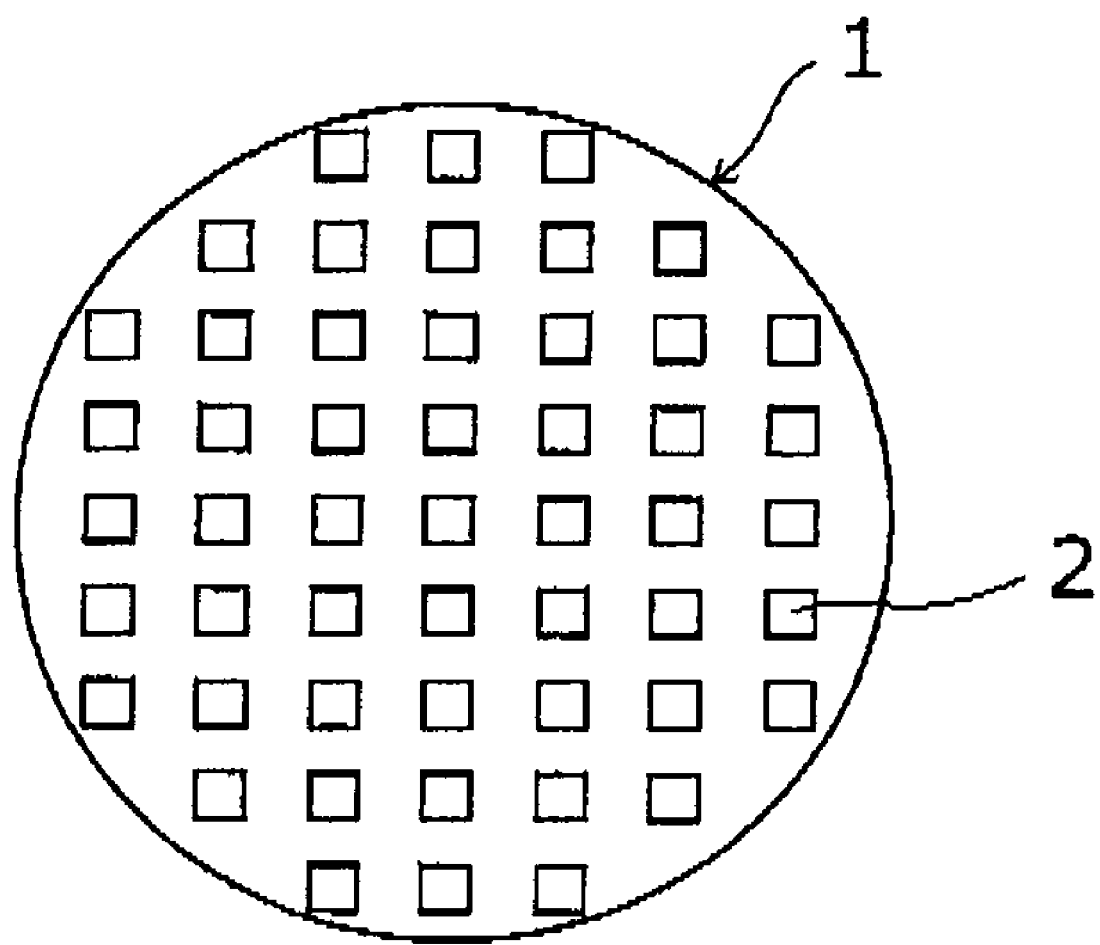
FIG. 1 is a plan view showing a doping mask used for selective doping in the method for manufacturing a semiconductor device according to the embodiment of the invention.

FIG. 1 is a plan view of a doping mask 1 used for the ion implantation.

Figure 2:
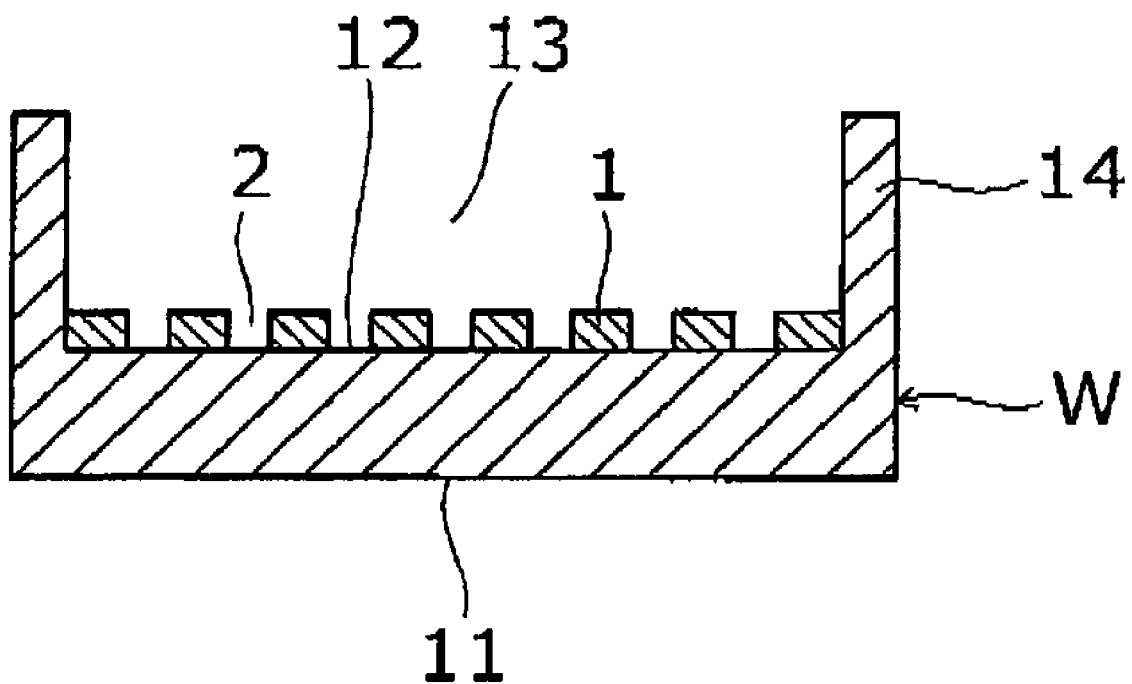
FIG. 2 is a schematic view showing the doping mask fit into the bottom of the recess in the semiconductor wafer W so that the second major surface is selectively covered with the doping mask.

FIG. 2 is a schematic view showing the doping mask 1 fit into the bottom of the recess 13 in the semiconductor wafer W so that the second major surface 12 is selectively covered with the doping mask 1.

The doping mask 1 is illustratively made of metal, organic material, glass, or ceramic. Alternatively, the doping mask 1 may be configured by combining at least two of metal, organic material, glass, and ceramic.

The doping mask 1 is shaped like a circular plate, in which many openings 2 are formed through its thickness. Each opening 2 is illustratively shaped like a rectangle several hundred μm to several mm square, but may also be circularly shaped. The opening ratio in the doping mask 1 is illustratively several to several ten percent.

Figure 4A:
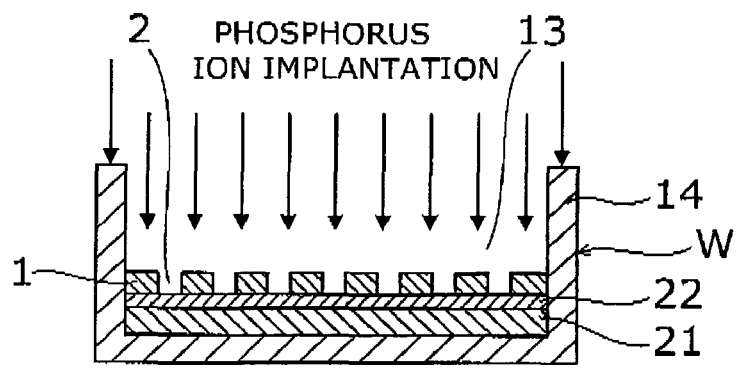
FIGS. 4A, 4B and 4C are process cross-sectional views in series of FIGS. 3A and 3B.

As shown in FIG. 4A, the doping mask 1 is fit into the bottom of the recess 13 of the semiconductor wafer W, and the surface of the collector layer 22 is selectively covered with the doping mask 1. In this condition, phosphorus is implanted, for example, at an acceleration voltage of 60 keV and a dose amount of $5\times10^{14}/cm^2$. Phosphorus is selectively implanted into the portion exposed in the openings 2 of the doping mask 1.

Figure 4B:
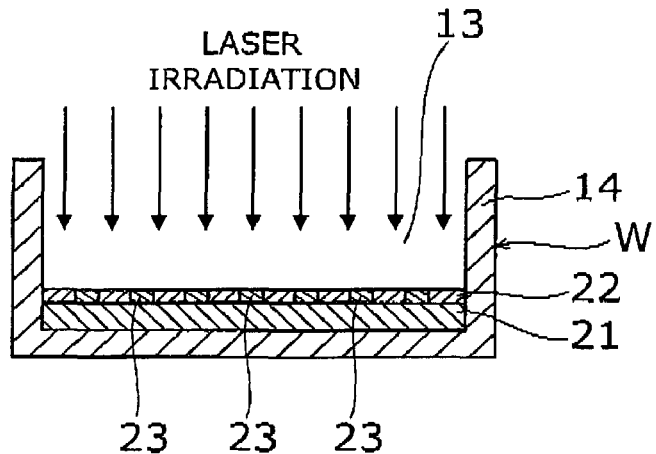

Next, after the doping mask 1 is removed from the recess 13, the entire surface of the collector layer 22 is laser-irradiated at an energy density of e.g. 1.4 J/cm$^2$ to activate phosphorus implanted in the step of FIG. 4A. Thus, as shown in FIG. 4B, n$^+$-type regions 23 are selectively formed in the collector layer 22.

Figure 4C:
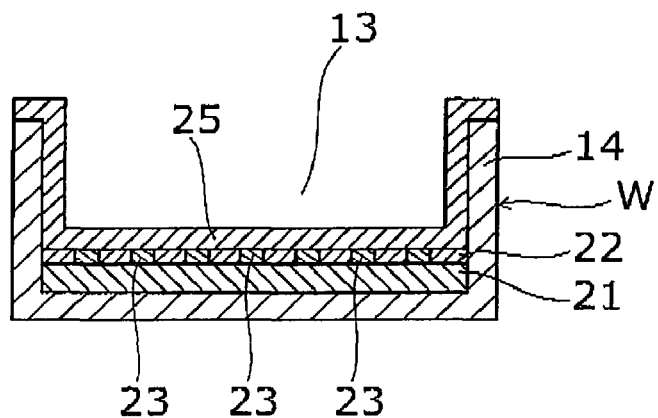

Next, as shown in FIG. 4C, a second main electrode 25 is formed on the inner wall including the bottom of the recess 13 by sputtering, for example. The second main electrode 25 is in contact with the anode layer 22 and the n$^+$-type regions 23. Thus the anode short structure on the backside of the IGBT is obtained.

Subsequently, the thinned portion of the semiconductor wafer W inside the periphery 14 is bored, or the periphery 14 is trimmed to the same thickness as that of the thinned portion. Then the wafer is diced and divided into individual semiconductor chips.

According to this embodiment, the doping mask 1 described above can be used to facilitate selective ion implantation even if one side of a semiconductor wafer is significantly recessed except its periphery and is difficult to uniformly spin-coat with a resist.

The activation process described with reference to FIG. 3B can be omitted. That is, the impurities introduced by the ion implantation as shown in FIG. 3A and the impurities introduced by the ion implantation as shown in FIG. 4A can be activated at once by the activation step as shown in FIG. 4B.

On the other hand, the collector layer 22 can be formed by introducing p-type impurity (such as boron) selectively into the wafer W by using a mask (not shown). That is, by using a mask which is formed by reversing the mask 1, the p-type impurity is selectively introduced into the wafer W so that the collector layer 22 can be formed between the n$^+$-type regions 23. In this case, the activation of the implanted impurities can also be performed by the separate steps as shown in FIGS. 3B and 4B, or can be performed at once by a single step as shown in FIG. 4B.

Figure 5:
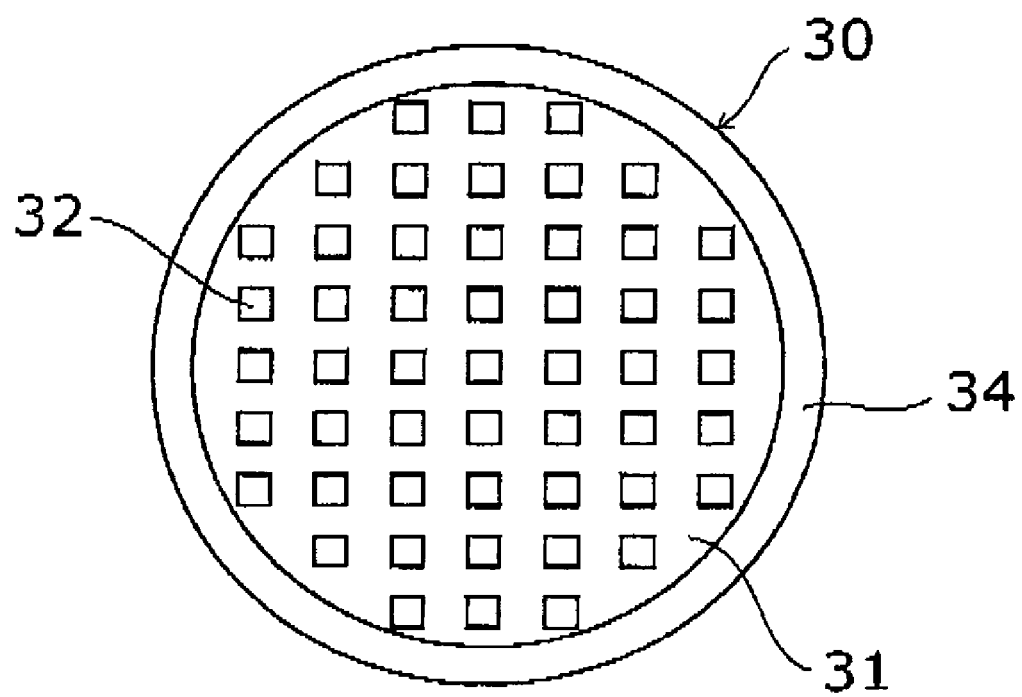
FIG. 5 is a plan view showing the other embodiment of doping mask used for selective ion implantation in the method for manufacturing a semiconductor device according to the embodiment of the invention.

FIG. 5 is a plan view of another example doping mask.

Figure 6:
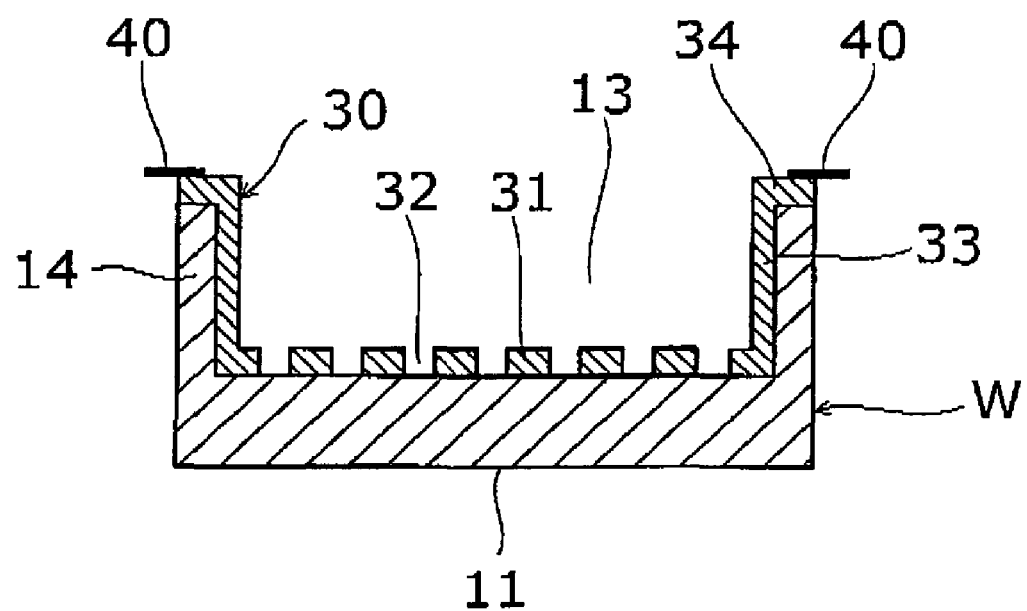
FIG. 6 is a schematic cross-sectional view showing the doping mask of FIG. 5 fit into the recess in the semiconductor wafer W so that the second major surface is selectively covered with the doping mask.

FIG. 6 is a schematic cross-sectional view showing the doping mask 30 of FIG. 5 fit into the recess 13 in the semiconductor wafer W so that the second major surface 12 is selectively covered with the doping mask 30.

The doping mask 30 includes a circular plate 31, many openings 32 formed through the thickness of the circular plate 31, a cylindrical sidewall 33 integrally provided at the periphery of the circular plate 31 and being generally perpendicular to the circular plate 31, and a ring-shaped flange 34 integrally provided at the top end of the sidewall 33 and protruding radially outward.

When selective ion implantation is performed on the second major surface located at the bottom of the recess 13 in the semiconductor wafer W, the circular plate 31 of the doping mask 30 is fit into the bottom of the recess 13 to selectively cover the second major surface. The sidewall 33 of the doping mask 30 covers the inner peripheral surface of the periphery 14 in the semiconductor wafer W. The flange 34 of the doping mask 30 covers the top end face of the periphery 14 in the semiconductor wafer W.

The flange 34 of the doping mask 30 is pressured between a retainer 40 and the top end face of the periphery 14 of the semiconductor wafer W, and the flange 34 of the doping mask 30 is pressed against the top end face of the periphery 14 of the semiconductor wafer W by the retainer 40. This can prevent problems such as misalignment of ion implantation due to uplift of the doping mask 30.

In the above embodiment, doping is performed by ion implantation. However, other methods such as plasma doping and laser doping may also be suitably used. Furthermore, besides laser irradiation, dopant activation may also be performed by heat treatment such as furnace annealing.

The invention claimed is:

1. A method for manufacturing a semiconductor device from a semiconductor wafer having a first major surface, a recess provided inside a periphery on opposite side of the first major surface and surrounded by the periphery, and a second major surface provided at bottom of the recess, the method comprising:
    fitting into the recess a doping mask having selectively formed openings to selectively cover the second major surface with the doping mask;
    selectively introducing dopant into the second major surface; and
    forming a semiconductor layer of a first conductive type on a surface portion of the second major surface of the semiconductor wafer by introducing dopant into an entire surface of the second major surface of the semiconductor wafer and activating the introduced dopant, wherein
    the selectively introducing dopant into the second major surface includes selectively introducing dopant of a second conductivity type into the semiconductor layer of the first conductivity type, and
    the doping mask includes
        a circular plate having the openings and selectively covering the second major surface; and
        a sidewall integrally provided at a periphery of the circular plate and covering an inner peripheral surface of the periphery in the semiconductor wafer.

2. The method for manufacturing a semiconductor device according to claim 1, wherein the selectively introducing dopant is performed by ion implantation.

3. The method for manufacturing a semiconductor device according to claim 1, wherein the selectively introducing dopant is performed by plasma doping.

4. The method for manufacturing a semiconductor device according to claim 1, wherein the selectively introducing dopant is performed by laser doping.

5. The method for manufacturing a semiconductor device according to claim 1, wherein the doping mask further includes a flange integrally provided at a top end of the sidewall and covering a top end face of the periphery in the semiconductor wafer.

6. The method for manufacturing a semiconductor device according to claim 5, wherein the flange of the doping mask is pressed against the top end face of the periphery of the semiconductor wafer.

7. The method for manufacturing a semiconductor device according to claim 1, further comprising:
    after introducing the dopant, removing the doping mask from the recess; and
    laser-irradiating the second major surface to activate the introduced dopant.

8. The method for manufacturing a semiconductor device according to claim 1, wherein of the introduced dopant is activated by a furnace annealing after introducing the dopant and removing the doping mask from the recess.

9. The method for manufacturing a semiconductor device according to claim 1, wherein the doping mask is made of at least one selected from metal, organic material, glass, and ceramic.

* * * * *